(12) United States Patent
Nable et al.

(10) Patent No.: US 12,410,520 B2
(45) Date of Patent: Sep. 9, 2025

(54) STACKING TOOL FIXTURE FOR FORCED FLOW CHEMICAL VAPOR INFILTRATION

(71) Applicant: Raytheon Technologies Corporation, Farmington, CT (US)

(72) Inventors: Jun Nable, Hamden, CT (US); Alyson T. Burdette, Gilbertsville, PA (US)

(73) Assignee: RTX Corporation, Farmington, CT (US)

( * ) Notice: Subject to any disclaimer, the term of this patent is extended or adjusted under 35 U.S.C. 154(b) by 133 days.

(21) Appl. No.: 17/957,610

(22) Filed: Sep. 30, 2022

(65) Prior Publication Data

US 2024/0110281 A1    Apr. 4, 2024

(51) Int. Cl.
*C23C 16/458* (2006.01)
*C23C 16/04* (2006.01)

(52) U.S. Cl.
CPC .......... *C23C 16/458* (2013.01); *C23C 16/045* (2013.01)

(58) Field of Classification Search
CPC .............................. C23C 16/045; C23C 16/046
See application file for complete search history.

(56) References Cited

U.S. PATENT DOCUMENTS

| | | | |
|---|---|---|---|
| 5,480,678 A | 1/1996 | Rudolph et al. | |
| 5,904,957 A * | 5/1999 | Christin | C23C 16/455 427/255.12 |
| 7,691,440 B2 | 4/2010 | Bernard et al. | |
| 2004/0071877 A1 * | 4/2004 | Goujard | C04B 41/4531 427/255.28 |
| 2004/0237898 A1 * | 12/2004 | Bernard | C23C 16/45578 118/724 |
| 2004/0253377 A1 * | 12/2004 | Bok | C23C 16/545 427/249.2 |
| 2005/0178327 A1 | 8/2005 | Rudolph et al. | |
| 2008/0152803 A1 | 6/2008 | Lamouroux et al. | |
| 2011/0064891 A1 * | 3/2011 | Golecki | C04B 35/83 427/587 |
| 2015/0218693 A1 | 8/2015 | Bertrand et al. | |
| 2017/0073808 A1 | 3/2017 | Tanibuchi | |
| 2019/0284692 A1 | 9/2019 | Melnik et al. | |

OTHER PUBLICATIONS

Extended European Search Report for EP Application No. 23199558.0, dated Mar. 4, 2024, 7 pages.

* cited by examiner

*Primary Examiner* — Keath T Chen
(74) *Attorney, Agent, or Firm* — Kinney & Lange, P.A.

(57) ABSTRACT

A tooling assembly suitable for use in chemical vapor infiltration (CVI) comprises a plurality of tooling fixtures arranged as a tower, with a central channel extending therethrough along a channel axis, and a lid atop the tower and covering the central channel. Each tooling fixture of the plurality of tooling fixtures comprises a plurality of walls defining an internal volume, and a plurality of holes through at least one wall of the plurality of walls, the plurality of holes placing the internal volume in flow communication with an external environment. Each tooling fixture of the plurality of tooling fixtures is in physical contact with an adjacent tooling fixture.

20 Claims, 4 Drawing Sheets

STACKING TOOL FIXTURE FOR FORCED FLOW CHEMICAL VAPOR INFILTRATION

BACKGROUND

The present invention relates to chemical vapor infiltration (CVI), and more particularly to improved tooling for CVI.

The CVI process can be used to fill in the voids of a porous preform and form the matrix to create a composite. The CVI process relies primarily on diffusion of vaporous precursors around the porous preform to deposit the matrix material. Conventional CVI can, however, be inefficient, as it is slow to infiltrate a porous preform to an appreciable matrix volume. The long hours-on-gas (HoG) time to reach appreciable rigidization/infiltration can lead to increased production costs. Thus, a means of increasing CVI efficiency without compromising composite quality is desirable.

SUMMARY

A tooling assembly suitable for use in chemical vapor infiltration (CVI) comprises a plurality of tooling fixtures arranged as a tower, with a central channel extending therethrough along a channel axis, and a lid atop the tower and covering the central channel. Each tooling fixture of the plurality of tooling fixtures comprises a plurality of walls defining an internal volume, and a plurality of holes through at least one wall of the plurality of walls, the plurality of holes placing the internal volume in flow communication with an external environment. Each tooling fixture of the plurality of tooling fixtures is in physical contact with an adjacent tooling fixture.

A method of using a tooling assembly in a CVI process comprises assembling the tooling assembly by mounting a plurality of fibrous preforms within an internal volume of each of a plurality of respective tooling fixtures, arranging a first level from a first subset of the plurality of tooling fixtures such that each tooling fixture of the first subset is in physical contact with an adjacent tooling fixture of the first subset, arranging a second level from a second subset of the plurality of tooling fixtures such that each tooling fixture of the second subset is in physical contact with an adjacent tooling fixture of the second subset, the second level being atop the first level, and placing a lid atop the second level to cover a central channel defined by the first level and the second level. Each tooling fixture of the plurality of tooling fixtures comprises a plurality of walls defining the internal volume, and a plurality of holes through at least one wall of the plurality of walls, the plurality of holes placing the internal volume in flow communication with an external environment.

A tooling assembly suitable for use in chemical vapor infiltration (CVI) comprises a plurality of tooling fixtures arranged as a tower, with a central channel extending therethrough along a channel axis, and a lid atop the tower and covering the central channel. Each tooling fixture of the plurality of tooling fixtures comprises a plurality of walls defining an internal volume, and a plurality of holes through at least one wall of the plurality of walls, the plurality of holes placing the internal volume in flow communication with an external environment. Each tooling fixture of the plurality of tooling fixtures comprises a set of interlock features configured to mate with a corresponding set of interlock feature on adjacent tooling fixtures.

Figure 1:
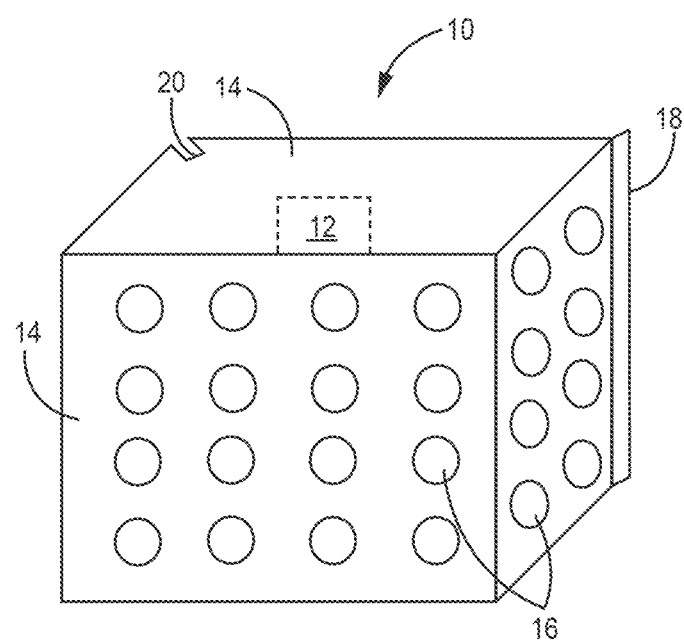
FIG. 1 is a simplified perspective view of a CVI tooling fixture.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

This disclosure presents tooling fixture designs and arrangements for inducing a forced flow during CVI. The arrangement of fixtures forms a central channel through which a flow of vaporous precursors can be directed. The flow through the central channel passes through the various fixtures to exit the arrangement, thereby infiltrating preforms contained within the fixtures.

FIG. 1 is a simplified perspective view of tooling fixture 10. As shown in FIG. 1, fixture 10 can have a generally cubic or cuboidal geometry, with an internal volume 12 defined by a plurality of sidewalls 14. Other geometries are contemplated herein. One or more of sidewalls 14 can be perforated with a number of infiltration holes 16 variously disposed in rows, columns, clusters, etc., placing the external environment in flow communication with internal volume 12. A fibrous preform (not shown) can be placed within internal volume 12 to be held securely in place during CVI. In an exemplary embodiment, the preform can be formed from bundled tows of silicon carbide (SiC) fibers arranged in one of various two or three-dimensional woven architectures such as plain, harness (e.g., 3, 5, 8, etc.), twill, braid, or non-symmetric to name a few non-limiting examples. In an alternative embodiment, the preform can be formed from non-woven (e.g., chopped, felted, etc.) fibers. Fixture 10 can further include interlock features, shown in FIG. 1 as flange 18 and slot 20. Such interlock features can secure fixture 10 to other, adjacent fixtures 10, as is discussed in greater detail below. Fixture 10 can be formed from graphite in an exemplary embodiment. Portions of fixture 10 can additionally and/or alternatively be formed from metallics, non-graphitic forms of carbon (e.g., carbon-carbon composites) and/or ceramics (e.g., SiC). Such features can, for example, include locating pins.

Figure 2:
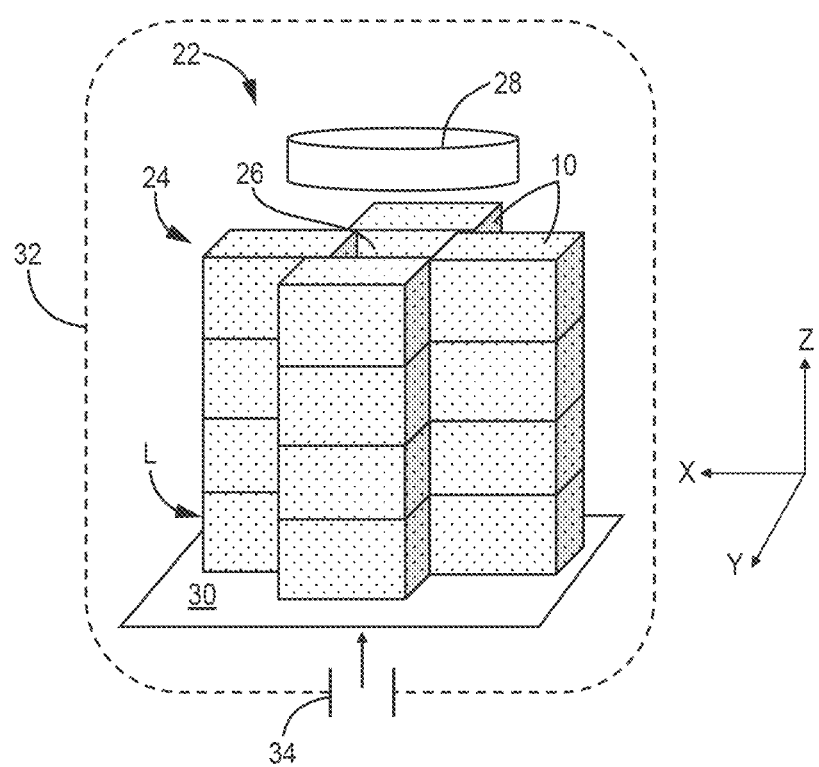
FIG. 2 is a simplified perspective view of a tooling assembly of multiple tooling fixtures arranged as a tower.

FIG. 2 is a simplified perspective view of tooling assembly 22, shown as a stacking arrangement or tower 24 of multiple tooling fixtures 10 stacked in the z-direction. More specifically, tower 24 includes four stacked levels L, each level L consisting of four adjacent, and preferably, interlocked fixtures 10. Tower 24 is arranged in such manner as to form central channel 26, which also extends in the z-direction, thus the z-axis can be synonymous with the channel axis in the embodiment shown. Tooling assembly 22 can further include a cover, or weighted lid 28, shown above and separate from fixtures 10 to facilitate visualization of central channel 26. However, in operation of tooling assembly 22 during CVI, weighted lid 28 can be placed atop the uppermost level L of tower 24 to prevent the flow of vaporous precursors from exiting the end/top of central channel 26, as is discussed in greater detail below. Tower 24 can be positioned upon base 30 in some embodiments, which can be used to support during assembly of tower 24 and during CVI. Base 30 with tooling assembly 22 can be positioned in CVI reactor 32, represented schematically by a dashed line in FIG. 2. Base 30 can have an opening (not shown) in communication with flow inlet 34, itself an inlet/opening placing the flow of vaporous precursors, indicated in by arrows in FIG. 2, in flow communication with central channel 26.

Figure 3:
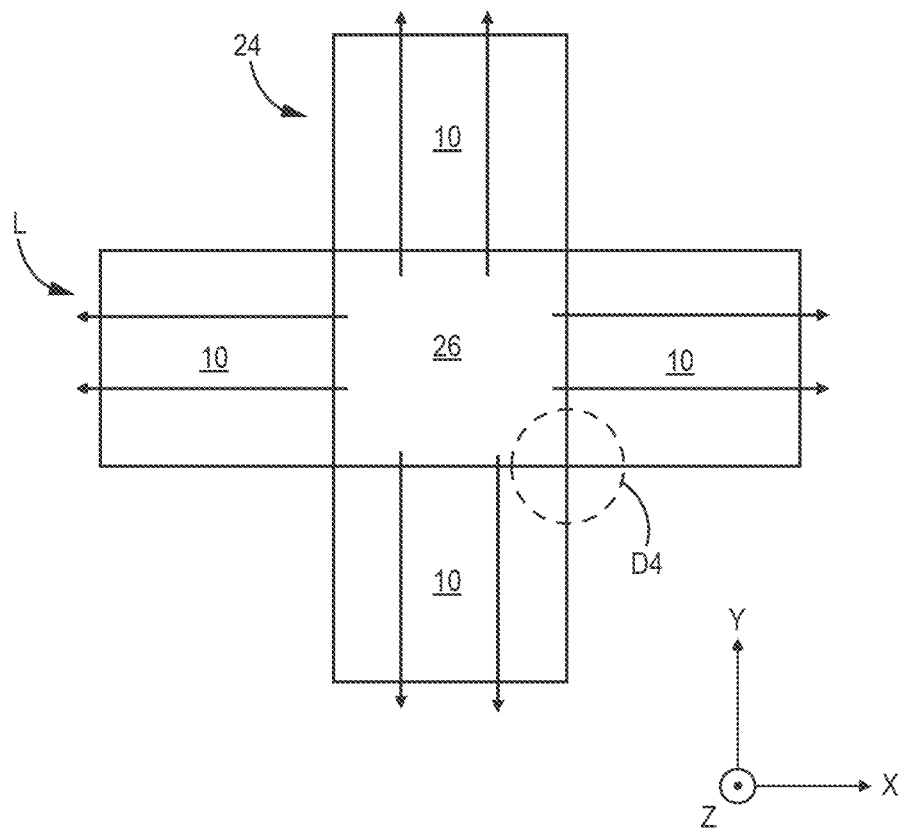
FIG. 3 is a simplified plan view of one level of the tower of FIG. 2.

FIG. 3 is a simplified elevation view of the uppermost level L of tower 24. In the illustrated embodiment, fixtures 10 are arranged corner-to-corner such that central channel 26 has a square cross-sectional geometry (i.e., in the x-y plane). Central channel 26 is generally sealed at the corners as a result of this arrangement, although not necessarily hermetically sealed. Weighted lid 28 (FIG. 3) seals (non-hermetically) tower 24 at the uppermost level L. As such, during CVI, as the flow of vaporous precursors enters central channel 26, the direction of the primary flow is upward in the z-direction, but portions of the flow can traverse individual fixtures 10 of tower 24 through infiltration holes 16 (FIG. 1). The direction of flow therefore can turn roughly 90° (i.e., in the x and/or y-direction) and exit fixtures 10. Arrows represent the general direction of flow through fixtures 10, but not necessarily the number of flow paths. Such number can depend on the number of holes 16. Weighted lid 28 maintains vapor pressure within central channel 26 and therefore encourages the flow to exit via fixtures 10. Preforms within fixtures 10 can therefore be exposed to a relatively higher mass flow rate than in conventional CVI processes. Process parameters such as inlet flow rate and temperature can also be varied to vary the flow rate through tower 24. As the various preforms are infiltrated, pores within the preforms close off and the vaporous precursors can no longer flow freely through the preforms. At a critical infiltration point of tower 24, a back pressure builds up within tower 24 and central channel 26. When a threshold pressure differential ($\Delta P$) is reached between central channel 26 and the external environment (within reactor 32), weighted lid 28 is forced slightly upward allowing an amount of the flow to escape from beneath weighted lid 28. The venting of flow in this regard can signal sufficient infiltration of preforms within tower 24 such that the process can be concluded thereafter.

Figure 4:
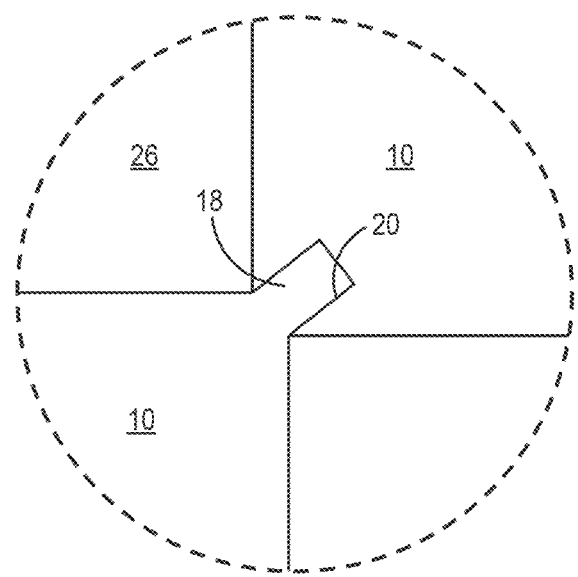
FIG. 4 is an enlarged view of detail D4 of FIG. 3.

FIG. 4 is an enlarged view of detail D4 of FIG. 3. As shown in FIG. 4, flange 18 on one corner of a fixture 10 interlocks with slot 20 on the adjacent corner of a neighboring fixture 10. In addition to sealing the edges of central channel 26, these interlocking features help prevent shifting of fixtures 10 during assembly, as well as during the build-up of pressure within central channel 26 and tower 24 during CVI. In an alternative embodiment, other types of interlock features (e.g., fasteners, clamps, etc.) can be used. In yet another alternative embodiment, interlocking features may be excluded, and something like a stopper or a wedge placed elsewhere within reactor 32 can be used to maintain the position of fixtures 10.

The following alternative features can also be included without departing from the scope of the invention. Alternatively shaped (i.e., non-cubic) fixtures 10 can be used in one embodiment. Tower 24 can include any number of levels L, including a single level L. The number of levels L can be constrained based upon, for example, reactor 32 dimensions and/or structural stability. Although a four-sided tower structure is illustrated in FIGS. 2 and 3, each level L can include groups of more or fewer than four fixtures 10, (e.g., three fixtures 10) symmetrically disposed to form a triangular central channel 26 in one embodiment. Other geometries, stacking arrangements, etc. are contemplated herein.

To infiltrate and/or densify preforms using tooling assembly 22, preforms can be loaded into/mounted within individual fixtures 10. The loaded fixtures 10 can be secured to adjacent fixtures 10 (e.g., using interlock features) and arranged into tower 24, and weighted lid 28 placed atop uppermost level L. Tooling assembly 22 can then be placed into CVI reactor 32 and exposed to the flow of vaporous precursors. Tooling assembly 22 with fixtures 10 can be used when infiltrating preforms via CVI, to deposit interface coatings (e.g., layers of BN, SiC, Si-doped BN, etc.) and/or to form a matrix (e.g., SiC) to create a CMC part. Such CMC parts can be incorporated into aerospace, maritime, or industrial equipment, to name a few, non-limiting examples.

DISCUSSION OF POSSIBLE EMBODIMENTS

The following are non-exclusive descriptions of possible embodiments of the present invention.

A tooling assembly suitable for use in chemical vapor infiltration (CVI) comprises a plurality of tooling fixtures arranged as a tower, with a central channel extending therethrough along a channel axis, and a lid atop the tower and covering the central channel. Each tooling fixture of the plurality of tooling fixtures comprises a plurality of walls defining an internal volume, and a plurality of holes through at least one wall of the plurality of walls, the plurality of holes placing the internal volume in flow communication with an external environment. Each tooling fixture of the plurality of tooling fixtures is in physical contact with an adjacent tooling fixture.

The tooling assembly of the preceding paragraph can optionally include, additionally and/or alternatively, any one or more of the following features, configurations and/or additional components:

In the above tooling assembly, each tooling fixture of the plurality of tooling fixtures can further include a set of interlock features configured to mate with a corresponding set of interlock feature on adjacent tooling fixtures.

In any of the above tooling assemblies, the set of interlock features can include a flange and a slot, the flange being insertable with a slot of a first adjacent tooling fixture, and the slot configured to receive the flange of a second adjacent tooling fixture.

In any of the above tooling assemblies, the tower formed by the plurality of tooling fixtures can include a plurality of axially-stacked levels.

In any of the above tooling assemblies, each level can include four tooling fixtures.

In any of the above tooling assemblies, the central channel can be at least partially defined by one wall of each of the four tooling fixtures.

In any of the above tooling assemblies, each tooling fixture of the plurality of tooling fixtures can be formed from graphite.

In any of the above tooling assemblies, each tooling fixture of the plurality of tooling fixtures can have a cubic or cuboidal geometry.

A CVI system can include a reactor, any of the above tooling assemblies contained within the reactor, and a fibrous preform contained within each tooling fixture of the tooling assembly.

In the above system, the reactor can include an inlet for receiving a flow of vaporous precursor, and the inlet can be in flow communication with the central channel.

In any of the above systems, the tooling assembly can be mounted on a base within the reactor.

A method of using a tooling assembly in a CVI process comprises assembling the tooling assembly by mounting a plurality of fibrous preforms within an internal volume of each of a plurality of respective tooling fixtures, arranging a first level from a first subset of the plurality of tooling fixtures such that each tooling fixture of the first subset is in physical contact with an adjacent tooling fixture of the first subset, arranging a second level from a second subset of the plurality of tooling fixtures such that each tooling fixture of the second subset is in physical contact with an adjacent tooling fixture of the second subset, the second level being atop the first level, and placing a lid atop the second level to cover a central channel defined by the first level and the second level. Each tooling fixture of the plurality of tooling fixtures comprises a plurality of walls defining the internal volume, and a plurality of holes through at least one wall of the plurality of walls, the plurality of holes placing the internal volume in flow communication with an external environment.

The method of the preceding paragraph can optionally include, additionally and/or alternatively, any one or more of the following features, configurations and/or additional components:

In the above method, assembling the tooling assembly can further include securing each tooling fixture of the first subset to an adjacent tooling fixture of the first subset by inserting a flange of each tooling fixture into a slot of the adjacent tooling fixture, and securing each tooling fixture of the second subset to an adjacent tooling fixture of the second subset by inserting a flange of each tooling fixture into a slot of the adjacent tooling fixture.

Any of the above methods can further include placing the tooling assembly into a reactor.

Any of the above methods can further include introducing a flow of vaporous precursors into the reactor via an inlet of the reactor.

In any of the above methods, the central channel can be in flow communication with the inlet of the reactor such that the flow enters the central channel.

Any of the above methods can further include continuing the flow of the vaporous precursors into the reactor until after a portion of the flow escapes from under the lid.

A tooling assembly suitable for use in chemical vapor infiltration (CVI) comprises a plurality of tooling fixtures arranged as a tower, with a central channel extending therethrough along a channel axis, and a lid atop the tower and covering the central channel. Each tooling fixture of the plurality of tooling fixtures comprises a plurality of walls defining an internal volume, and a plurality of holes through at least one wall of the plurality of walls, the plurality of holes placing the internal volume in flow communication with an external environment. Each tooling fixture of the plurality of tooling fixtures comprises a set of interlock features configured to mate with a corresponding set of interlock feature on adjacent tooling fixtures.

The tooling assembly of the preceding paragraph can optionally include, additionally and/or alternatively, any one or more of the following features, configurations and/or additional components:

In the above tooling assembly, the set of interlock features can include a flange and a slot, the flange being insertable with a slot of a first adjacent tooling fixture, and the slot configured to receive the flange of a second adjacent tooling fixture.

In any of the above tooling assemblies, the tower formed by the plurality of tooling fixtures can include a plurality of axially-stacked levels.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A tooling assembly suitable for use in chemical vapor infiltration (CVI), the tooling assembly comprising:
   a plurality of tooling fixtures arranged around a central channel, the central channel extending along a channel axis, the plurality of tooling fixtures arranged such that a perimeter of the central channel at an axial location along the channel axis is defined by a set of multiple tooling fixtures of the plurality of tooling fixtures disposed about the axial location, wherein each tooling fixture of the plurality of tooling fixtures comprises:
      a plurality of walls defining an internal volume configured to contain a fibrous preform; and
      a plurality of holes through at least one wall of the plurality of walls, the plurality of holes placing the internal volume in flow communication with an external environment;
      wherein each of the plurality of tooling fixtures further comprises a set of interlock features configured to mate with corresponding interlock features of adjacent tooling fixtures, thereby joining the set of multiple tooling fixtures to define and seal the perimeter of the central channel; and
   a lid atop and covering the central channel.

2. The tooling assembly of claim 1, wherein the set of interlock features comprises a flange and a slot, the flange being insertable with a slot of a first adjacent tooling fixture, and the slot configured to receive the flange of a second adjacent tooling fixture.

3. The tooling assembly of claim 1, wherein the plurality of tooling fixtures comprises a plurality of axially-stacked levels, each of the plurality of axially-stacked levels comprising a set of multiple tooling fixtures arranged to define the perimeter of the central channel at respective axial locations.

4. The tooling assembly of claim 3, wherein each level comprises four tooling fixtures arranged to define a cubic or cuboidal central channel geometry.

5. The tooling fixture of claim 4, wherein the central channel is at least partially defined by one wall of each of the four tooling fixtures.

6. The tooling assembly of claim 1, wherein each of the plurality of tooling fixtures is formed from graphite.

7. The tooling assembly of claim 1, wherein each tooling fixture of the plurality of tooling fixtures has a cubic or cuboidal geometry.

8. A CVI system comprising:
   a reactor;
   the tooling assembly of claim 1 contained within the reactor; and
   a fibrous preform contained within each tooling fixture of the tooling assembly.

9. The system of claim 8, wherein the reactor comprises an inlet for receiving a flow of vaporous precursor, and wherein the inlet is in flow communication with the central channel.

10. The system of claim 8, wherein the tooling assembly is mounted on a base within the reactor.

11. The tooling assembly of claim 1, wherein the set of interlock features span a height of each of the plurality of tooling fixtures along the channel axis.

12. A tooling assembly suitable for use in chemical vapor infiltration (CVI), the tooling assembly comprising:
    a plurality of tooling fixtures arranged around a central channel, the central channel extending along a channel axis, the plurality of tooling fixtures arranged to form:
        a first level comprising a first subset of the plurality of tooling fixtures arranged around the central channel such that a perimeter of the central channel at an axial location of the first level is defined by the first subset of the plurality of tooling fixtures; and
        a second level comprising a second subset of the plurality of tooling fixtures, the second level stacked atop the first level along the channel axis and arranged around the central channel such that a perimeter of the central channel at an axial location of the second level is defined by the second subset of the plurality of tooling fixtures;
    wherein each tooling fixture of the plurality of tooling fixtures comprises:
        a plurality of walls defining an internal volume configured to contain a fibrous preform;
        a plurality of holes through at least one wall of the plurality of walls, the plurality of holes placing the internal volume in flow communication with an external environment; and
        a set of interlock features configured to mate with corresponding interlock features on adjacent tooling fixtures in each of the first level and the second level, thereby joining each of the first subset of the plurality of tooling fixtures and the second subset of the plurality of tooling fixtures to define and seal the perimeter of the central channel; and
    a lid atop and covering the central channel.

13. The tooling assembly of claim 12, wherein the set of interlock features comprises a flange and a slot, the flange being insertable with a slot of a first adjacent tooling fixture, and the slot configured to receive the flange of a second adjacent tooling fixture.

14. The tooling assembly of claim 12, wherein the set of interlock features span a height of each of the plurality of tooling fixtures along the channel axis.

15. A method of assembling a tooling assembly in a CVI process, the method comprising:
    mounting a plurality of fibrous preforms within an internal volume of each of a plurality of respective tooling fixtures, each tooling fixture of the plurality of tooling fixtures comprising:
        a plurality of walls defining the internal volume; and
        a plurality of holes through at least one wall of the plurality of walls, the plurality of holes placing the internal volume in flow communication with an external environment;
    arranging a first level from a first subset of the plurality of tooling fixtures such that each tooling fixture of the first subset is in physical contact with an adjacent tooling fixture of the first subset;
    arranging a second level from a second subset of the plurality of tooling fixtures such that each tooling fixture of the second subset is in physical contact with an adjacent tooling fixture of the second subset, the second level being atop the first level; and
    placing a lid atop the second level to cover a central channel defined by the first level and the second level;
    wherein the first subset of the plurality of tooling fixtures and the second subset of the plurality of tooling fixtures are arranged around a central channel, the central channel extending along a channel axis, the plurality of tooling fixtures arranged such that a perimeter of the central channel is defined by the first subset of tooling fixtures at a first plurality of axial locations along the channel axis and defined the second subset of tooling fixtures at a second plurality of axial locations along the channel axis; and
    wherein each of the plurality of tooling fixtures further comprises a set of interlock features configured to mate with corresponding interlock features of adjacent tooling fixtures within each of the first level and the second level, thereby joining each of the first subset and the second subset of the plurality of tooling fixtures to define and seal the perimeter of the central.

16. The method of claim 15, wherein the interlock features comprise a flange and a slot and wherein assembling the tooling assembly further comprises:
    securing each tooling fixture of the first subset to an adjacent tooling fixture of the first subset by inserting the flange of each tooling fixture into the slot of the adjacent tooling fixture; and
    securing each tooling fixture of the second subset to an adjacent tooling fixture of the second subset by inserting the flange of each tooling fixture into the slot of the adjacent tooling fixture.

17. The method of claim 15 and further comprising: placing the tooling assembly into a reactor.

18. A method of using the tooling assembly of claim 12, the method comprising:
    placing the tooling assembly into a reactor; and
    introducing a flow of vaporous precursors into the reactor via an inlet of the reactor.

19. The method of claim 18, wherein the central channel is in flow communication with the inlet of the reactor such that the flow enters the central channel.

20. The method of claim 19 and further comprising: continuing the flow of the vaporous precursors into the reactor until after a portion of the flow escapes from under the lid.

* * * * *